(12) United States Patent
Jones

(10) Patent No.: US 7,298,131 B2
(45) Date of Patent: Nov. 20, 2007

(54) CURRENT SENSORS

(75) Inventor: Lawrence Anthony Jones, Liverpool (GB)

(73) Assignee: Lem Heme Limited, Lancashire (GB)

( * ) Notice: Subject to any disclaimer, the term of this patent is extended or adjusted under 35 U.S.C. 154(b) by 153 days.

(21) Appl. No.: 10/433,761

(22) PCT Filed: Nov. 28, 2001

(86) PCT No.: PCT/GB01/05226

§ 371 (c)(1),
(2), (4) Date: Oct. 23, 2003

(87) PCT Pub. No.: WO02/46777

PCT Pub. Date: Jun. 13, 2002

(65) Prior Publication Data

US 2004/0095125 A1     May 20, 2004

(30) Foreign Application Priority Data

Dec. 7, 2000    (GB) ................. 0029953.7

(51) Int. Cl.
*G01R 19/20* (2006.01)
*G01R 33/00* (2006.01)
*G01R 31/02* (2006.01)

(52) U.S. Cl. ............... 324/117 R; 324/754; 324/158.1

(58) Field of Classification Search ............... 324/127, 324/117 R, 117 H, 251, 252, 126, 117
See application file for complete search history.

(56) References Cited

U.S. PATENT DOCUMENTS

| | | | | |
|---|---|---|---|---|
| 3,582,774 A * | 6/1971 | Forgacs | .................. | 324/649 |
| 4,059,798 A * | 11/1977 | Dierker et al. | ............. | 324/127 |
| 4,272,724 A * | 6/1981 | Wada et al. | .............. | 324/253 |
| 4,799,005 A * | 1/1989 | Fernandes | ................ | 324/127 |
| 4,914,381 A * | 4/1990 | Narod | ................ | 324/117 R |
| 5,057,769 A * | 10/1991 | Edwards | ............... | 324/127 |
| 5,349,289 A * | 9/1994 | Shirai | ................. | 324/127 |
| 5,493,211 A * | 2/1996 | Baker | ................. | 324/130 |
| 5,825,175 A * | 10/1998 | Selcuk | ................ | 324/117 H |
| 6,232,775 B1* | 5/2001 | Naitoh et al. | ............... | 324/249 |
| 6,411,078 B1* | 6/2002 | Nakagawa et al. | ..... | 324/117 H |

* cited by examiner

*Primary Examiner*—Ha Tran Nguyen
*Assistant Examiner*—Emily Y Chan
(74) *Attorney, Agent, or Firm*—Jennifer L. Skord; Moore & Van Allen, PLLC

(57) ABSTRACT

A current sensor comprises an outer shielding means (4), a toroidal inner core and inner shield means (1). A combined driving and sensing winding (3) is wound around the inner core. First and second ends of the winding (3) are connectable to a sensor head. The inner shield means (1) has a gap (1A) formed in it.

5 Claims, 7 Drawing Sheets

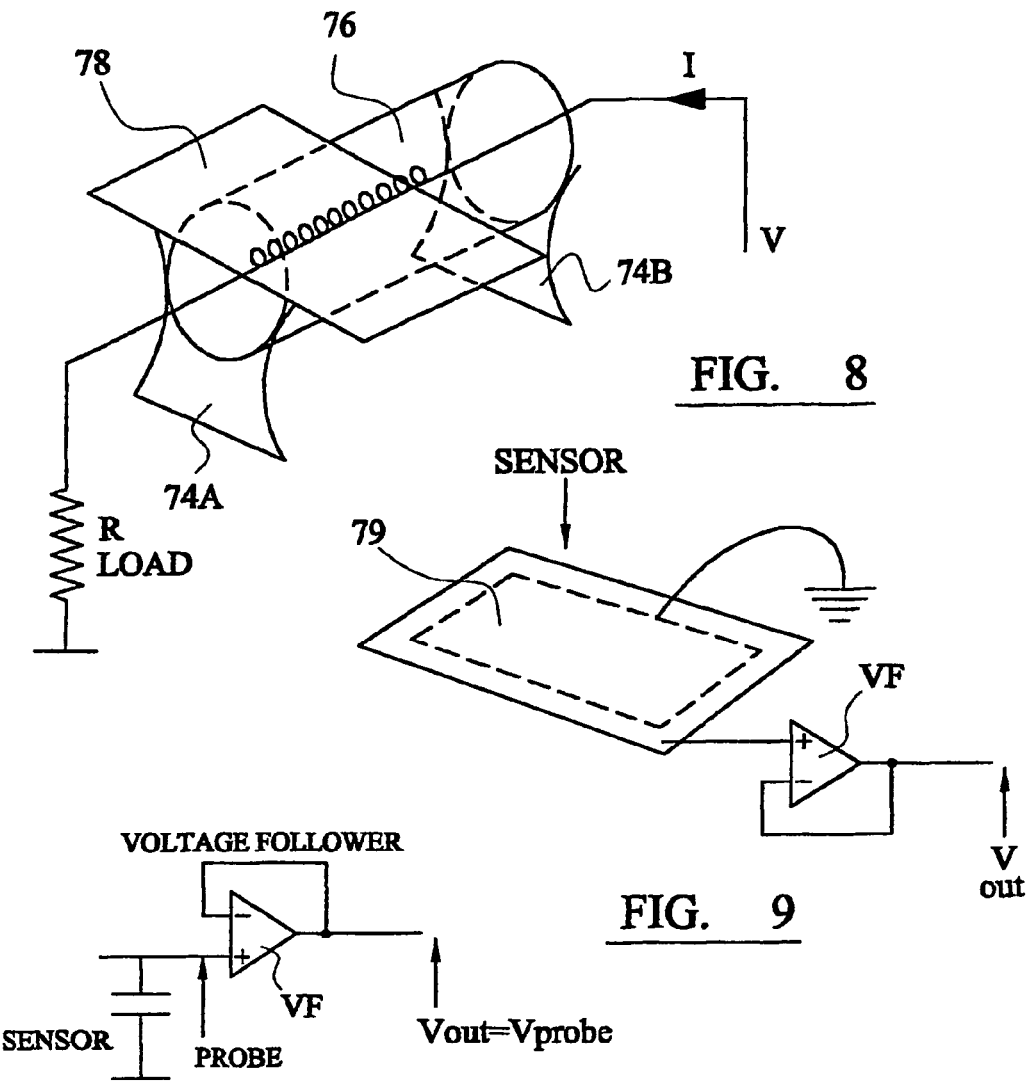
FIG. 8
FIG. 9
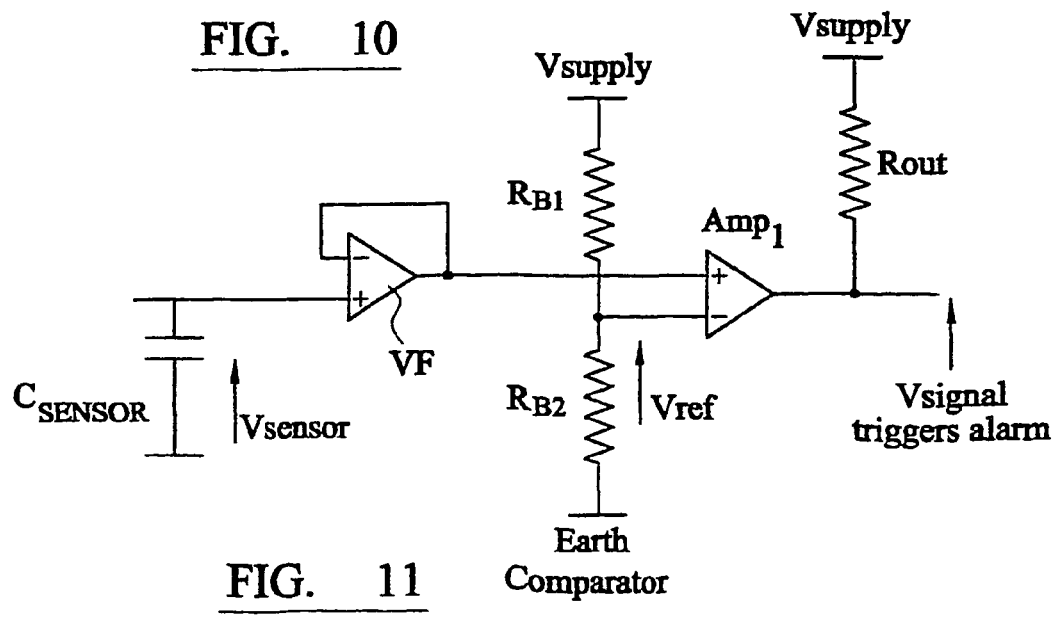
FIG. 10
FIG. 11

CURRENT SENSORS

This is a Continuation of PCT/GB01/05226 filed Nov. 28, 2001.

FIELD OF THE INVENTION

The invention relates to current sensors.

BACKGROUND ART

In the prior art, there are described many different ways for non-invasively measuring current flowing in a conductor. One well known method is to use what is known as a direct current transformer which typically uses a relatively low frequency excitation current and using a two-core method. In such a two-core method, a DC current through the two cores biases each with flux at the same polarity, while the flux in one core due to a modulator drive remains out of phase with that in the second. Each core reaches a saturation flux level so that it reaches saturation flux level at a different point in the excitation cycle for one alternation than for the other alternation. The result is an output signal at even harmonics of the excitation frequency.

Techniques such as the above are used to provide an absolute measurement of current. In many cases however, such as monitoring insulation breakdown in high current conductors, it is required to measure leakage currents in the presence of very high drive currents. For instance, DC motors on locomotives might have a drive current of 3000 amps and the leakage current desired to be monitored for insulation breakdown may well be in the order of milliamps. In such cases, the large drive currents result in very large magnetic fields and, even though send and return conductors may carry almost the same current, it is clear that the fringing magnetic fields which in this case will not be insignificant, would not cancel and will be dependent on the position of the conductors within the cores. There would therefore result a positionally dependent measurement and no coherent information would be recoverable. Some manufacturers have sought to obviate these problems by utilising complicated bus bar geometry so as to cancel out the fringing magnetic fields. However, apart from being costly such solutions are often not practical.

SUMMARY OF THE INVENTION

It is a first aim of embodiments of the present invention to provide a novel current sensing apparatus which allows the measurement of small leakage currents in the presence of high drive currents without requiring complicated bus bar geometry.

It is a further aim of embodiments of the present invention to provide a current sensor geometry in which only a single measurement core is required.

It is a still further aim to provide means for monitoring insulation breakdown in conductors.

According to a first aspect of the invention, there is provided a current sensor comprising an outer shielding means, a toroidal inner core and inner shield means, there being further provided a combined driving and sensing winding being wound around said inner core, first and second ends of said winding being connectable to a sensor head, said inner shield means having a gap formed therein.

Preferably, the inner shield means is located in a region inside an inner diameter of the inner core. Said inner shield means preferably comprises a ring of material.

The ring of material may be of, for instance, a magnetic steel. The inner ring may be laminated.

Preferably, a cover piece is provided for supporting the magnetic sensor. Preferably, the cover piece is of a non-conductive, preferably plastics, construction.

Preferably, the outer shielding means comprises an outer core forming an outer periphery of said current sensor. The outer core may comprise a series of laminations.

Preferably, the outer core is provided with a gap formed therein.

Preferably, the gap in the outer core is not aligned with the gap in the inner core.

Preferably, the laminations comprise a magnetic steel.

Preferably, the inner core comprises high performance ferromagnetic material.

The inner core may comprise an amorphous ferromagnetic alloy.

The inner core may comprise a high nickel ferromagnetic alloy.

Preferably, said winding has a first end which is arranged to receive a drive signal and a second end which is arranged for providing an output sensing signal. Preferably, the second end is connected to a sense resistor.

Preferably, the first end is connected to a source of excitation at a frequency F. Preferably, the second end is connected to a band pass filter centred at a frequency of 2F. Preferably, the frequency F is substantially 4 KHz.

Preferably, the output of the band pass filter is thereafter rectified and integrated.

Preferably, the sensor winding is excited by means of a source of excitation applied to a first, inverting, input of a differential amplifier. Preferably, the second, non-inverting, input of the differential amplifier is connected to earth and the output of the differential amplifier being connected to the first end of the winding.

Preferably, the rectified band pass filtered and integrated output is fed back to the inverting input of the differential amplifier via a feed back resistor.

The integrated rectified band pass filtered output may be further connected to processing circuitry. The processing circuitry may include data logging circuitry. The data logging circuitry may be arranged to monitor occurrences of non-zero outputs against time.

If the number of non-zero outputs within a given time period exceeds a threshold value, then the data logging circuitry may output a warning signal.

The warning signal may give notice that an unacceptable level of leakage current has occurred within a given time period.

Such data logging circuitry may be useful in monitoring insulation breakdown in conductors.

According to a second aspect of the invention, there is provided a clamp on probe comprising a first limb and a second limb, the first and second limbs being shaped so as to cooperate with one another to form a substantially complete magnetic circuit when the probe is in a closed configuration, the probe being characterized by the following features: said first and second limbs comprise ferromagnetic material which act as a flux guide when said probe surrounds a current carrying conductor, said first and second limbs each being provided with a recess in their inner periphery in which first and second current sensors means are housed, said first and second recesses being arranged so as to shield said first and second current sensing means located therein from field effects caused by the earth's magnetic field, and wherein said first and second current sensors are connected differentially so as to respond to a differential magnetic field produced by the conductor around which the probe is fitted.

Preferably, said first and second current sensors comprise linear flux gates.

Preferably, said first and second sensors are driven, in use, at a high frequency, preferably in the range of 80 to 200 KHz.

Preferably, the two sensors are driven in parallel at a frequency of substantially 120 KHz.

Preferably, each sensor is connected in series with a capacitor which is tuned to resonance.

Preferably, output voltages across the two capacitors are fed to a differential amplifier and subtracted.

According to a third aspect of the invention, there is provided a fuse monitor, the monitor comprising a fuse holder for receiving a fuse, and an electric field strength sensor, wherein the electric field strength sensor is disposed so as to capacitively charge in response to current flow through the fuse.

Preferably, the electric field strength sensor is substantially planar and arranged such that one face is directed towards a position in which the fuse is, in use, received.

Said electric field strength sensor may comprise a foil.

Preferably, the electric field strength sensor is connected via signal processing means to an alarm indicator arranged to display whether the said fuse is intact or blown.

The signal processing means may comprise a high input impedance voltage follower.

The signal processing means may comprise a comparator circuit for comparing an electrostatically induced voltage of the electric field strength sensor with a reference voltage.

The fuse monitor may further comprise a current sensor for monitoring, in use, current flow through a fuse received by the fuse holder.

Preferably, the current sensor is substantially toroidal and arranged, in use, to circumferentially surround the fuse in the fuse holder such that a conductor comprising said fuse extends through the aperture defined by the toroidal nature of the current sensor and in substantially parallel relation to a central axis of said current sensor.

The current sensor is preferably a sensor in accordance with the first aspect of the invention.

For a better understanding of the invention, and to show how embodiments of the same may be carried into effect, reference will now be made, by way of example, to the accompanying diagrammatic drawings in which:

BRIEF DESCRIPTION OF THE DRAWINGS

FIG. 8 illustrates the positioning of the electric field sensor in relation to the fuse and fuse holder of FIG. 7;

FIG. 9 illustrates schematically how the electric field sensor may be connected to provide an output indicative of the integrity of a fuse;

FIG. 10 is an equivalent circuit of the schematic arrangement shown in FIG. 9; and FIG. 11 illustrates how such an electric field sensor may be combined with external circuitry to provide a voltage alarm.

DESCRIPTION OF THE PREFERRED EMBODIMENTS

Figure 1:
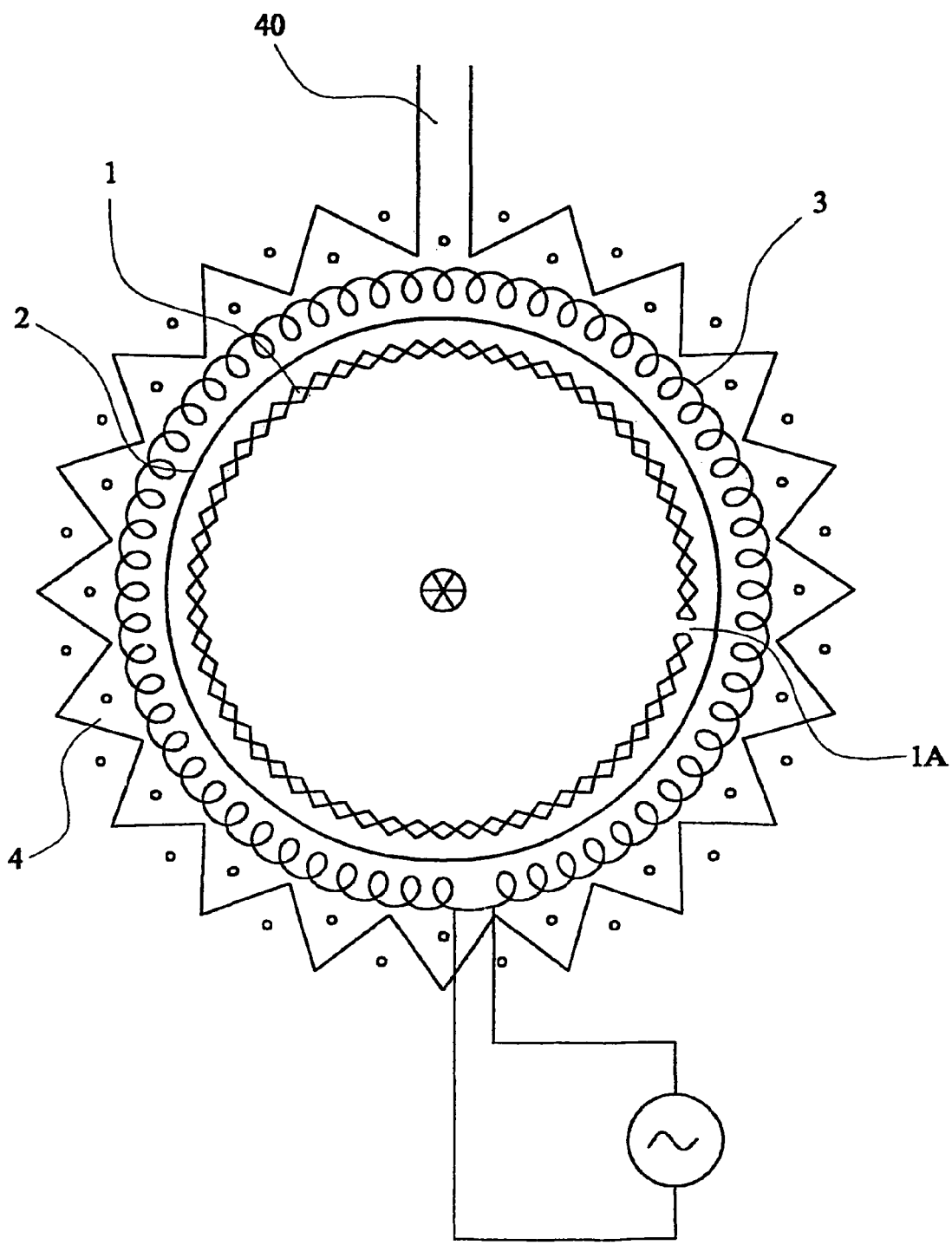
FIG. 1 is a schematic electrical circuit diagram illustrating a current sensor in accordance with a first embodiment of the invention.

Referring now to FIG. 1, there is shown a current sensor in accordance with the first aspect of the invention.

The current sensor probe comprises an inner shield 1, a cover piece 2, a toroidal winding 3 and an outer shielding means comprising an outer shield means wound on an inner core.

The inner shield 1 is shaped as an incomplete ring and includes a gap 1A separating end faces of the ring. The gap is small in comparison to the circumference of the inner shield 1 and in typical applications may be of the order of 1 or 2 mm, whilst the circumference of the inner shield 1 may be in typical applications around 30 cm.

The toroidal winding 3 is formed on an inner core comprising a material having a substantially square B-H loop with high intrinsic permeability. Such a material may be, for instance, nickel iron or an amorphous ferromagnetic alloy.

The outer shield 4 shields at least an outer periphery of the winding 3 from external field effects and may comprise a series of magnetic steel laminations. The laminations forming the outer shield 4 do not form a complete ring, but instead are separated by a small gap 40 at adjacent end faces. This gap may typically be around 2 mm, the purpose of the outer core is to confine all fringing fields and give positional independence to the sensor. In this way, with send and receive cables running inside the inner periphery of the probe and surrounded by the probe, the measurement result is independent of proximity of those send and receive cables as both of their fringing fields will be confined to the outer core and will sum to zero when there is no leakage current present. The purpose of the gap 40 is to increase the saturation level of the outer core for a given excitation.

Figure 2:
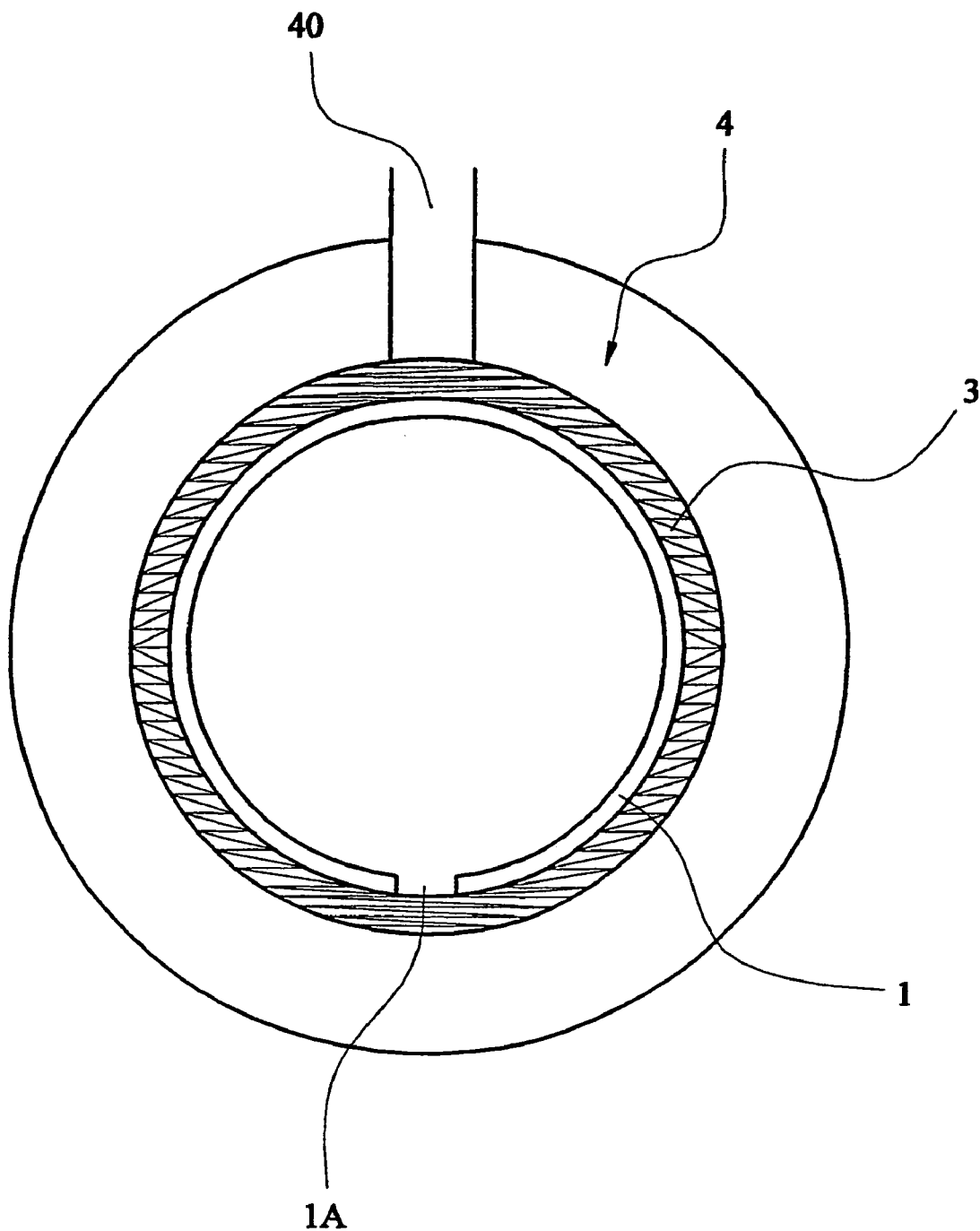
FIG. 2 is a plan external view of the sensor of FIG. 1.

Referring now to FIG. 2, there is shown in plan view the external appearance of a magnetic sensor as described in relation to FIG. 1. As can be seen, the outer shield 4 is built up of a number of laminations and features gap 40. Inside the outer shield, there is the toroidal winding 3 formed on the inner core. Then, concentrically arranged inside of the toroidal winding 3 there is the inner shield 1, with gap 1A.

Figure 3C:
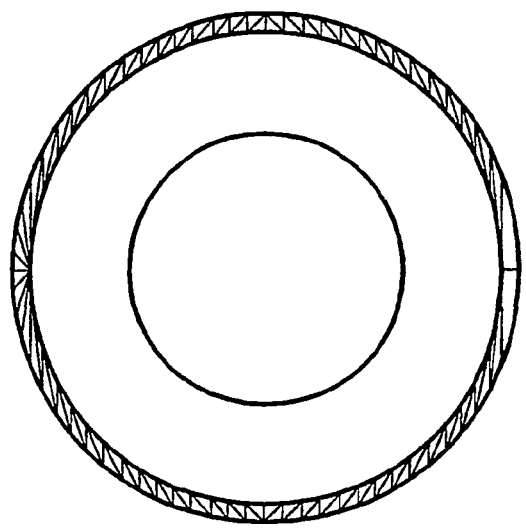
FIGS. 3A to C show a plastics cover piece for use with the sensor of FIGS. 1 and 2.
Figure 3B:
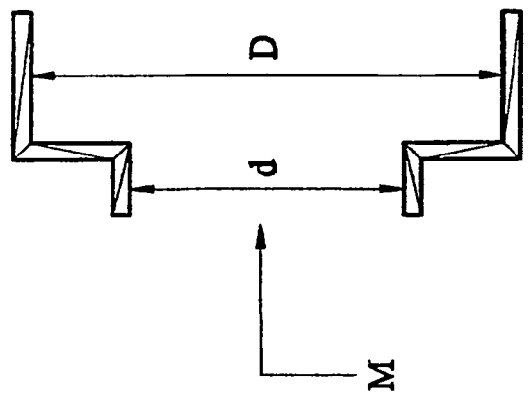
Figure 3A:
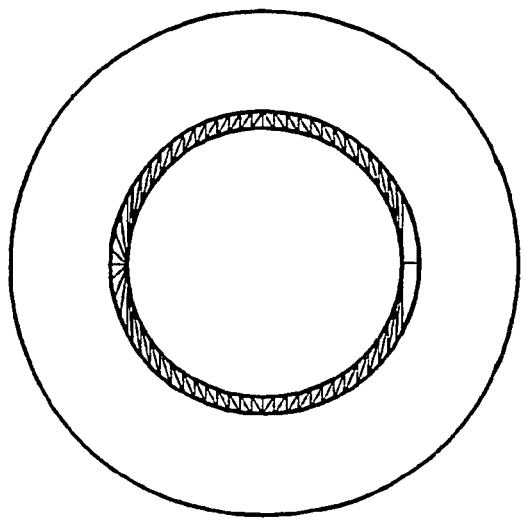

Referring now to FIGS. 3A to 3C, there is shown a cover piece which holds the arrangement of FIG. 2. The cover piece 2 is shown in bottom plan view in FIG. 3A, in top plan view in FIG. 3C and in sectional view in FIG. 3B. The cover piece 2 is a stepped plastics member having a first, larger, inner diameter D which is arranged to be the same as the outer diameter of the outer shield 4 shown in FIG. 2. A second, inner diameter d of the cover piece 2 is arranged to be the same as the inner diameter of the inner shield 1. Therefore, as can be seen, the magnetic sensor arrangement of FIG. 2 may be simply placed into the plastics cover piece 2 and, in use, the conductors which are to be monitored with regard to current detection may be fed into a mouth region M (shown in FIG. 3B) and fed through the sensor to pass within the inner diameter of the inner shield 1.

Figure 4:
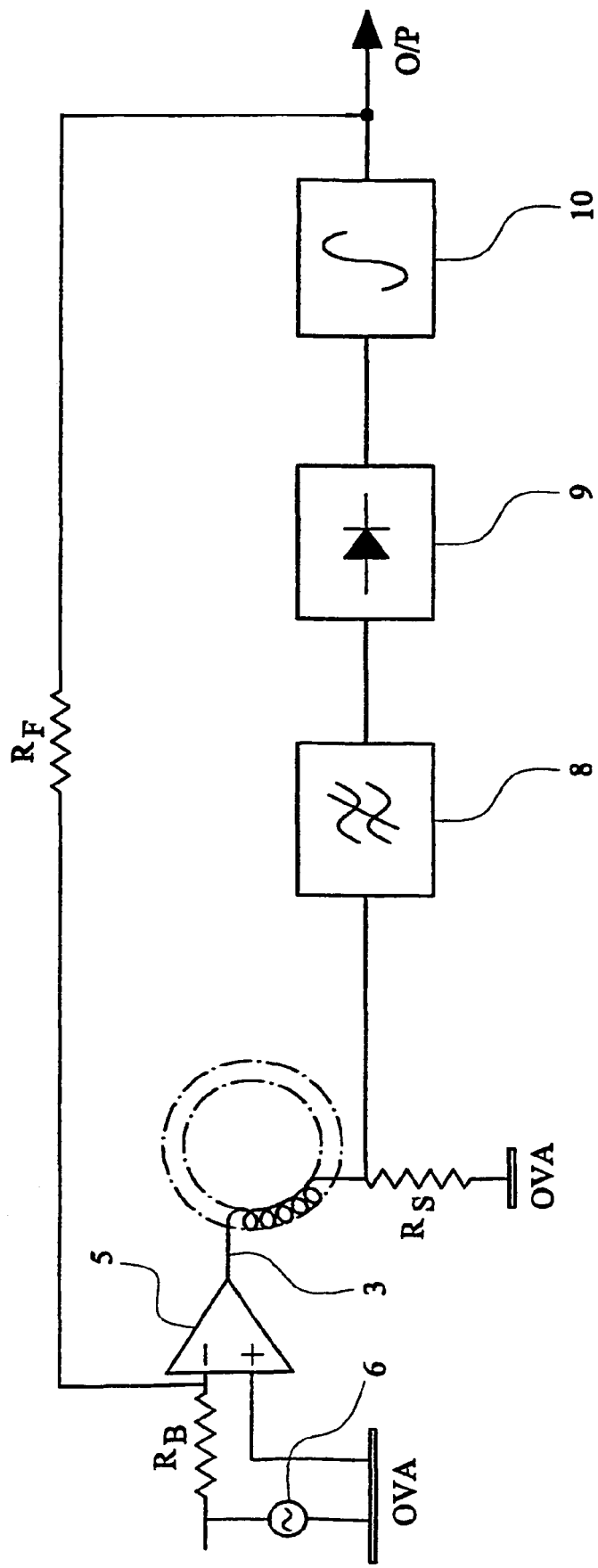
FIG. 4 illustrates a circuit for driving and sensing the output of the current sensor of FIGS. 1 and 2.

FIG. 4 shows a circuit which may be used in combination with the current sensor of FIGS. 1 and 2. In the circuit, there is shown a differential amplifier 5, having its non-inverting input grounded and its inverting input connected to a source 6 of excitation at 4 KHz via a bias resistor $R_B$. The inverting input is also connected to a feedback loop via a feedback resistor $R_F$. The output of the differential amplifier 5 is connected to the sensor winding 3 to provide drive to the one end of the winding 3, the other end of the winding 3 being connected via a sense resistor $R_s$ to earth. The junction of the sense resistor $R_s$ and the winding 3 is connected to the input of a band pass second harmonic filter 8, centred at 8 KHz. The output of the filter 8 is fed to a rectifier 9, whose output is then fed to an integrator 10 and the integrated rectified second harmonic output is thereafter fed to processing circuitry and (typically) display and/or data logging circuitry (not shown). The output is thereafter fed back through the feed back resistor $R_F$ to the inverting input of the differential amplifier 5.

In a sensor of the type described in relation to FIGS. 1 and 2, there is a linear relationship between the second harmonic voltage signal and the external magnetic field. If the sensor is excited asymmetrically, then it produces even harmonics. It is this even harmonic, the second harmonic at 8 KHz, that is therefore demodulated, integrated and used as the controlling voltage to close the feedback loop. The control voltage is an indication of the strength of the magnetic field and, thus, the concomitant current.

As mentioned previously, when there are no leakage currents because of the geometry of the current sensor of FIG. 1, currents flowing within the core will sum to zero. However, when there is a leakage current, such currents will produce a non-zero core response which, by virtue of the gap 1A causes the current sensor of FIG. 2 to produce an output which directly relates to that leakage current and enables very small currents to be measured in the presence of very high drive currents.

Leakage currents give a measure of the integrity of conductor insulation as where there is insulation breakdown, leakage currents occur. In this regard, the sensor of FIGS. 1 and 2 and the circuit of FIG. 4 can be connected to a data logger so as to monitor the occurrence of such leakage currents over time. In this way, the condition of insulation can be monitored to allow timely replacement before deterioration progresses beyond an acceptable level.

Figure 5:
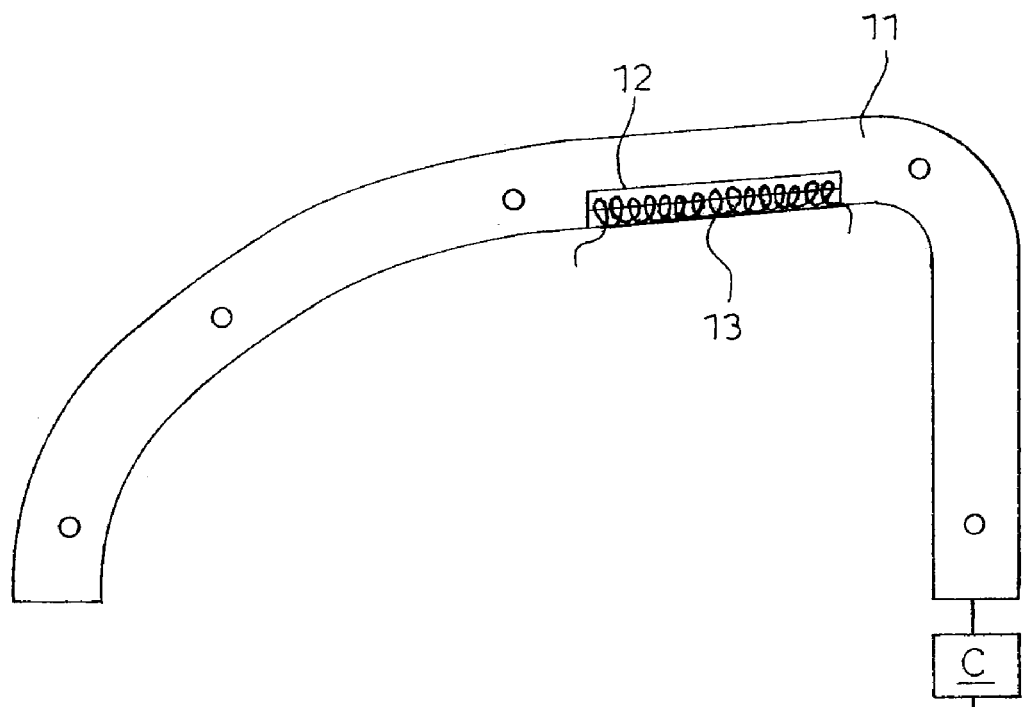
FIG. 5 is a view of a first limb of a probe according to the second aspect of the invention.
Figure 6:
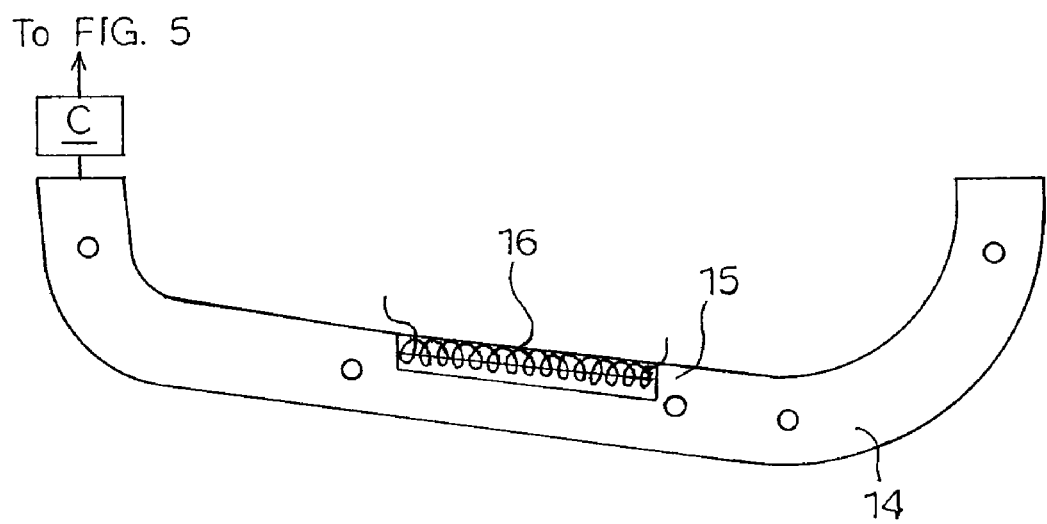
FIG. 6 is a view showing a second limb of a probe in accordance with the second-aspect.

Referring now to FIGS. 5 and 6, there is shown another aspect of the present invention. FIG. 5 shows a first, upper limb of a current sensing probe and FIG. 6 shows a second, lower limb of the same probe.

In FIG. 5, the upper limb comprises a core 11, having a recess 12 formed therein. In the recess 12, there is provided a linear flux gate 13. Similarly, in FIG. 6, the lower limb comprises a core 14, having a recess 15 formed therein and a linear flux gate 16 situated within the recess 15.

In use, the upper and lower limbs of the probe of FIGS. 5 and 6 form first and second jaws of a clamp-on probe. Traditional clamp-on current sensing probes utilise Hall sensors for detecting the magnetic field resulting from an electric current passing through a conductor. These sensors are, in the main, insensitive to electric currents less than 10 mAmps. There is a market requirement for a probe to measure such values.

The positioning of the flux gates 13, 16 within recesses 12, 15 is done so as to reduce earth field effects.

The two flux gate sensors 13, 16 are connected differentially (not shown) so as to respond to a differential magnetic field produced by a conductor.

The flux gate sensitivity is dependent upon a number of factors: the number of turns, length of core material and the coupling between the coil and the core material.

The two sensors are driven in parallel at a frequency of 120 Khz. Each sensor is in series with a capacitor C tuned to resonance. The output voltages across the two capacitors C are fed to a differential amplifier and subtracted. The reason for this is that the two sensors do not attain saturation simultaneously, because they are both exposed to different external earth field values. Consequently, the two second harmonic signals are not in phase. It can thus be seen that if these two signals are subtracted, then the carrier signals will cancel out and only the second harmonic signals will remain. These second harmonic signals are then rectified on both the positive and negative peaks and the resulting DC offsets are summed to zero through an integrator. Circuitry similar to that shown in FIG. 4 can be adapted for such use.

The phase shift is detected as a DC offset change, because the system comprises a carrier that is both phase and amplitude modulated. The integrator drives a power output stage which drives a compensation coil, resulting in the cancellation of the sampled field.

Figure 7:
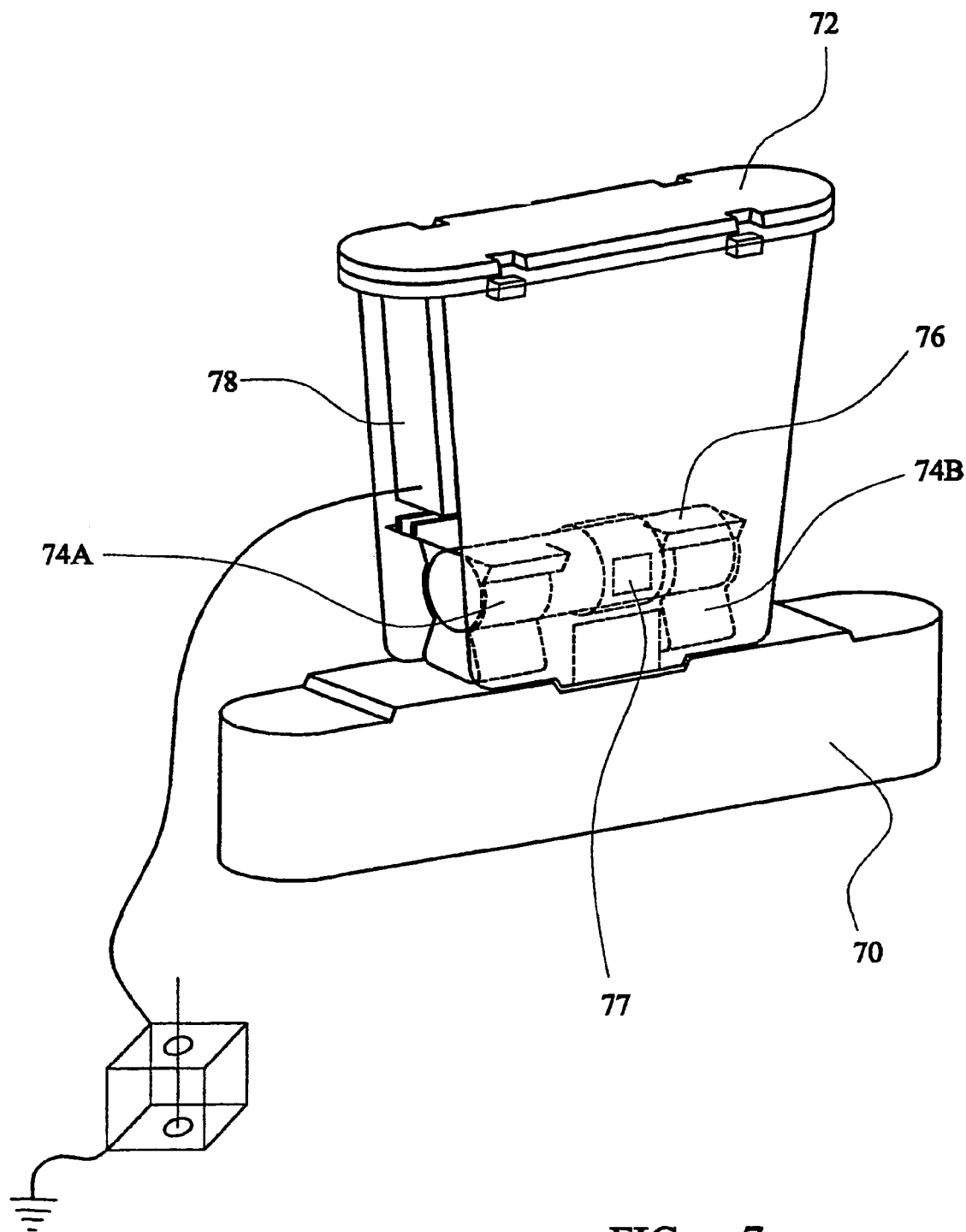
FIG. 7 is a view showing a fuse and fuse holder including a current sensor in accordance with the first aspect and further incorporating an electric field strength sensor.

FIG. 7 shows a further embodiment of the present invention and in particular shows a fuse holder including a current sensor along with electric field strength sensing means.

Considering FIG. 7 in detail, there is shown, a housing 70 and a fuse carrier 72. The fuse carrier further includes fuse holding brackets 74A, 74B in which a fuse 76 is insertable, a current sensor 77 through which the fuse 76 is insertable and which is arranged, in use, to circumferentially surround the fuse 76. There is also provided an electric field strength sensor 78 built into a wall of the fuse carrier 72.

The current sensor 77 is preferably of the type discussed earlier. There is now described the operation of the electric field strength sensor 78 and this is described with the aid of FIGS. 8 to 11 (in which, for clarity, the current sensor 77 is omitted).

Referring to FIG. 8, there is shown a fuse 76, electric field strength sensor 78 and fuse holding brackets 74A, 74B. There is also shown in schematic form a nominal load represented by load resistor $R_{load}$ and a current path (I) which in accordance with convention flows in a positive direction from a voltage source V, through the fuse 76 and into a load $R_{load}$.

The electric field strength sensor 78 may, conveniently, comprise a capacitive or electro-static inductive sensor, perhaps being a simple piece of foil, such as a thin aluminium foil. This electric field strength sensor 78 effectively charges up capacitively in accordance with the current I flowing through the fuse. Indeed, the sensor 78 should be mounted as close to the fuse as possible so that one side of this piece of foil is directed towards the conductor comprising the fuse 76. This electric field strength sensor 78 is also preferably shielded from other external electrical fields so that the charge on the electric field strength sensor 78 varies substantially in accordance with the current I flowing through the fuse 76. This shield is represented schematically as an element 70 in FIG. 9.

As is shown schematically in FIG. 9, the piece of foil comprising the electric field strength sensor 78 is shielded by earthed element 79 to minimise external field effects and the sensor 78 is connected to a high input impedance voltage follower VF. The shield 79 is insulated from the sensor 78, for instance, by being glued to one side of it by a non-conductive glue. The voltage follower VF must have a very high input impedence in order to avoid loading the electric field strength sensor 78. In this way, bias currents of the amplifier comprising VF must be very small, otherwise the electrostatically induced charge on the sensor 78 will leak away to contribute to the bias current. Also, input capacitance of the amplifier must be low.

FIG. 10 shows the equivalent circuit of FIG. 9, with the sensor 78 being represented by capacitance $C_{sensor}$.

Referring now to FIG. 11, there is shown a voltage alarm circuit for indicating whether or not the fuse 76 is intact. The circuitry of FIG. 11 comprises sensor 78 represented by $C_{sensor}$, voltage follower VF as described in relation to FIG. 10, the output of voltage follower VF being input to the non-inverting input of an amplifier AMP1, amplifier AMP1 being connected as a comparator so that a reference voltage $V_{ref}$ appears at its inverting input, $V_{ref}$ being determined by biasing resistors $R_{B1}$ and $R_{B2}$ which are connected in series between a supply voltage $V_{supply}$ and earth. The inverting input of the amplifier AMP1 is connected the common connection between series connected bias resistors $R_{B1}$, $R_{B2}$ and the output of amplifier AMP1 is connected to an output pull-up resistor $R_{out}$.

The operation of FIG. 11 will now be described in two cases, in the first case the fuse 76 being intact, and in the second case, the fuse 76 being blown.

In the first case, where a current I flows through fuse 76, one side of the piece of foil comprising the electric field strength sensor 78 charges electrostatically as a consequence of the presence of current I. Because the sensor 78 reacts in a capacitive manner, the potential difference between the fuse electrode and the piece of foil comprising the sensor quickly increases and stabilises at a particular voltage $V_{sensor}$. In this first case, the voltage $V_{sensor}$ is buffered by the voltage follower VF and input to the non-inverting input of AMP1. This voltage is compared with $V_{ref}$ and, if $V_{sensor}$ is higher than $V_{ref}$ then AMP1 will output a non-zero voltage indicative of the fact that the fuse 76 is intact.

In the second case, where the fuse 76 is blown any charge on the electric field strength sensor 78 will dissipate and $V_{sensor}$ will reduce. Once $V_{sensor}$ has dropped below the level of $V_{ref}$ then the comparator formed by AMP1 will switch states so as to no longer output a positive voltage. With this switching of states, the output of AMP1 may be used to drive, for instance, an LED display indicating that the fuse 76 has blown.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extend to any novel one, or any novel combination, of the features disclosed in this specification (including any accompanying claims, abstract and drawings), or to any novel one, or any novel combination, of the steps of any method or process so disclosed.

The invention claimed is:

1. A clamp on probe comprising a first limb and a second limb, the first and second limbs being shaped so as to cooperate with one another to form a substantially complete magnetic circuit when the probe is in a closed configuration, the probe being characterized by the following features: said first and second limbs comprise ferromagnetic material and act as a flux guide when said probe surrounds a current carrying conductor, said first and second limbs each being provided with a recess in their inner periphery in which first and second recesses being arranged so as to shield a first and a second current sensing means located therein from field effects caused by the earth's magnetic field, and wherein said first and second sensors are connected in series respectively with first and second capacitors which are tuned to resonance, and said first and second current sensors are connected differentially so as to comprise linear flux gates and thereby to respond to a differential magnetic field produced by the conductor around which the probe is fitted and thereby, in use, to be able to detect electric currents less than 10 mAmps.

2. A probe as claimed in claim 1, wherein said first and second sensors are driven, in use, at a high frequency.

3. A probe as claimed in claim 2, wherein said sensors are driven in the range of 80 to 200 KHz.

4. A probe as claimed in claim 3, wherein the two sensors are driven in parallel at a frequency of substantially 120 KHz.

5. A probe as claimed in claim 1, wherein output voltages across the two capacitors are fed to a differential amplifier and subtracted.

* * * * *